US011977052B2

(12) United States Patent
Hsieh et al.

(10) Patent No.: US 11,977,052 B2
(45) Date of Patent: May 7, 2024

(54) ARRAYS OF ACOUSTIC TRANSDUCERS FOR PHYSICAL ANALYSIS OF BATTERIES

(71) Applicant: Liminal Insights, Inc., Emeryville, CA (US)

(72) Inventors: Andrew Gaheem Hsieh, Berkeley, CA (US); Barry James Van Tassell, El Cerrito, CA (US); Daniel Artemis Steingart, Princeton, NJ (US); Shaurjo Biswas, El Cerrito, CA (US); Robert Charles Mohr, Berkeley, CA (US)

(73) Assignee: Liminal Insights, Inc., Emeryville, CA (US)

( * ) Notice: Subject to any disclaimer, the term of this patent is extended or adjusted under 35 U.S.C. 154(b) by 0 days.

(21) Appl. No.: 17/023,036

(22) Filed: Sep. 16, 2020

(65) Prior Publication Data

US 2021/0096104 A1 Apr. 1, 2021

Related U.S. Application Data

(63) Continuation of application No. 15/799,532, filed on Oct. 31, 2017, now Pat. No. 10,809,231.

(Continued)

(51) Int. Cl.
*G01N 29/04* (2006.01)
*B60L 50/64* (2019.01)
(Continued)

(52) U.S. Cl.
CPC .............. *G01N 29/04* (2013.01); *B60L 50/64* (2019.02); *B60L 58/10* (2019.02); *G01N 29/043* (2013.01);
(Continued)

(58) Field of Classification Search
CPC ...... G01N 29/04; G01N 29/043; G01N 29/07; G01N 29/11; G01N 29/262;
(Continued)

(56) References Cited

U.S. PATENT DOCUMENTS

| 4,314,265 | A |   | 2/1982 | Simko |
| 4,314,365 | A | * | 2/1982 | Petersen ................. E21B 47/16 |
|           |   |   |        | 175/56 |

(Continued)

FOREIGN PATENT DOCUMENTS

| WO | WO-2015023820 A2 * | 2/2015 | ............... B60L 3/12 |
| WO | 2016164457 A1 | 10/2016 | |

OTHER PUBLICATIONS

Krautkramer and Krautkramer, "Ultrasonic Testing of Materials", "introduction", 1977—p. 1 (Year: 1977).*

(Continued)

*Primary Examiner* — Lisa M Caputo
*Assistant Examiner* — Rose M Miller
(74) *Attorney, Agent, or Firm* — Polsinelli PC

(57) ABSTRACT

Systems and methods for analyzing physical characteristics of a battery include arrangements of two or more transducers coupled to the battery. A control module controls one or more of the two or more transducers to transmit acoustic signals through at least a portion of the battery, and one or more of the two or more transducers to receive response acoustic signals. Distribution of physical properties of the battery is determined based at least on the transmitted acoustic signals and the response acoustic signals.

20 Claims, 8 Drawing Sheets

Tx = Transmit (input signal)
Rx = Receive (response signal)

test sequence (Tx position, Rx position):

(1,1), (1,2), (1,3) ... (1,9)
(2,1), (2,2), (2,3) ... (2,9)
...
(9,1), (9,2), (9,3) ... (9,9)

Related U.S. Application Data

(60) Provisional application No. 62/416,506, filed on Nov. 2, 2016.

(51) Int. Cl.
   | | |
   |---|---|
   | *B60L 58/10* | (2019.01) |
   | *G01N 29/06* | (2006.01) |
   | *G01N 29/07* | (2006.01) |
   | *G01N 29/11* | (2006.01) |
   | *G01N 29/26* | (2006.01) |
   | *G01N 29/44* | (2006.01) |
   | *G01N 29/52* | (2006.01) |
   | *G01R 31/382* | (2019.01) |

(52) U.S. Cl.
   CPC ........ *G01N 29/0672* (2013.01); *G01N 29/07* (2013.01); *G01N 29/11* (2013.01); *G01N 29/262* (2013.01); *G01N 29/4418* (2013.01); *G01N 29/4472* (2013.01); *G01N 29/52* (2013.01); *G01N 2291/02818* (2013.01); *G01N 2291/02854* (2013.01); *G01N 2291/02863* (2013.01); *G01N 2291/02881* (2013.01); *G01N 2291/0289* (2013.01); *G01N 2291/044* (2013.01); *G01N 2291/048* (2013.01); *G01N 2291/106* (2013.01); *G01N 2291/2697* (2013.01); *G01R 31/382* (2019.01)

(58) Field of Classification Search
   CPC ......... G01N 2291/02818; G01N 2291/02881; G01N 2291/0289; G01N 2291/044; G01N 2291/048; G01N 2291/106; G01N 29/0672; G01N 29/4418; G01N 29/4472; G01N 29/52; G01N 2291/02854; G01N 2291/02863; G01N 2291/2697; G01N 29/4436; G01N 29/46; G01N 2291/2698; G01N 2291/0231; B60L 58/10; B60L 50/64; G01R 31/382
   USPC .......... 73/641, 602, 582, 579, 598, 597, 627
   See application file for complete search history.

(56) References Cited

U.S. PATENT DOCUMENTS

| | | |
|---|---|---|
| 4,387,597 A | 6/1983 | Brandestini |
| 2008/0028860 A1 | 2/2008 | Refko |
| 2008/0133156 A1* | 6/2008 | Redko ................ G01R 31/3865 702/63 |
| 2013/0269436 A1* | 10/2013 | Couse ................ G01N 29/4427 73/582 |
| 2016/0197382 A1 | 7/2016 | Sood |
| 2016/0223498 A1 | 8/2016 | Steingart et al. |
| 2018/0123189 A1* | 5/2018 | Biswas ............. H01M 10/4257 |
| 2019/0064123 A1* | 2/2019 | Steingart ............ G01N 29/4427 |
| 2019/0072614 A1* | 3/2019 | Steingart ........... H01M 10/4285 |
| 2019/0207274 A1 | 7/2019 | Ladpli |

OTHER PUBLICATIONS

International Search Report and Written Opinion dated Feb. 16, 2018 in International Application No. PCT/US2017/059661.

* cited by examiner

Two-Dimensional Arrays

ARRAYS OF ACOUSTIC TRANSDUCERS FOR PHYSICAL ANALYSIS OF BATTERIES

CROSS-REFERENCE TO RELATED APPLICATIONS

The present application for patent is a continuation of U.S. patent application Ser. No. 15/799,532, filed Oct. 31, 2017, which claims the benefit of Provisional Patent Application No. 62/416,506, filed Nov. 2, 2016, entitled "ARRAYS OF ACOUSTIC TRANSDUCERS FOR PHYSICAL ANALYSIS OF BATTERIES" and assigned to the assignee hereof and hereby expressly incorporated herein by reference in their entirety.

STATEMENT REGARDING FEDERALLY SPONSORED RESEARCH OR DEVELOPMENT

This invention was made with U.S. Federal Government support under Grant No. SBIR 1621926 awarded by the National Science Foundation. The U.S. Federal Government has certain rights in the invention.

FIELD OF DISCLOSURE

Disclosed aspects are directed to battery diagnostics. More specifically, exemplary aspects are directed to arrangements of sensors for use in physical analysis of one or more types and/or shapes of batteries.

BACKGROUND

The battery industry currently lacks an accurate, scalable method for directly measuring and monitoring the physical properties of batteries before, during, and after use. X-ray and photon sources used in battery diagnostics may be accurate but are expensive, and are not suitable for commercial installations. Electrical methods for battery diagnostics may be cheap and fast, which is why they are commonly used, but such electrical methods may provide inaccurate information about the internal components of batteries such as the various electrode layers, separation membranes, electrolyte, binder, etc. Physical properties of these internal components may change over time and use, and may degrade, particularly for batteries employed as a secondary battery. As such, there is a strong technological need in the art for the ability to analyze, measure, and monitor differences and changes in the physical properties of batteries, wherein the batteries may be employed in commercial settings or for personal use.

During operation, all batteries depend on the transport of charged species, though the mechanism of transport may vary depending on the type of the battery. Some modes of transport include electronic conduction, ionic conduction, diffusion, and flow or convection. A significant proportion of batteries are constructed with tabs for electrical connection to an external circuit. The placement of these tabs influences the spatial distribution of the properties of interest within a given battery, depending on the geometry of the battery.

For example, with reference to FIG. 1, various types of batteries are shown. In batteries of the type, cylindrical cell 102, the distributions of properties of interest therein are generally in the axial, radial, or thru directions or areal (i.e., combinations of directions); in batteries of the pouch, prismatic, or other rectangular cells 104, the distributions are lateral or areal; batteries of the type, coin or button cell 106, the distributions are generally in areal or in the thru direction.

While the electrical methods widely used in the battery industry at present are not capable of accurately recognizing and analyzing these spatial distributions in the physical properties of internal battery components, there has been some recent effort demonstrating the use of acoustic analysis to directly measure these properties. It has been shown that the acoustic responses of primary and secondary batteries change in repeatable and robust patterns that are unique to the chemistry and geometry of the batteries. Nevertheless, these analyses have been limited to either a single-point approach, in which a single transducer is used to send the input acoustic signal into the battery and also to measure acoustic response (also referred to as "pulse/echo" or "reflection" mode), or a single-pair approach, in which one transducer is used to send the input acoustic signal into the battery and another transducer is used to measure the acoustic response (also referred to as "transmission" or "through" mode). Neither approach is fully able to detect the distribution in physical properties.

In order to fully-resolve the spatial distribution in physical properties, there is accordingly a need for systems and techniques that are able to make measurements at multiple points along the cell.

SUMMARY

Exemplary aspects of this disclosure are directed to systems and methods for analyzing physical characteristics of a battery, including arrangements of multiple transducers configured to capture the distributions in physical properties of batteries.

For example, an exemplary aspect is directed to an apparatus comprising an arrangement of two or more transducers coupled to a battery. The apparatus comprises a control module configured to control one or more of the two or more transducers to transmit acoustic signals through at least a portion of the battery, and one or more of the two or more transducers to receive response acoustic signals, and an analyzer configured to determine a distribution of physical properties of the battery based on the transmitted acoustic signals and the response acoustic signals.

Another exemplary aspect is directed to an apparatus comprising an arrangement of two or more means for transmitting acoustic signals through at least a portion of a battery, and one or more means for receiving response signals based on the acoustic signals transmitted through at least the portion of the battery. The apparatus further comprises means for determining a distribution of physical properties of the battery based at least in part on the transmitted acoustic signals and response signals.

Yet another exemplary aspect is directed to a method of analyzing physical characteristics of a battery, the method comprising coupling an arrangement of two or more transducers to a battery, transmitting acoustic signals from the two or more transducers through at least a portion of the battery, receiving response acoustic signals to the transmitted acoustic signals by one or more of the two or more transducers, and determining a distribution of physical properties of the battery based on analyzing the transmitted acoustic signals and the response acoustic signals.

BRIEF DESCRIPTION OF THE DRAWINGS

The accompanying drawings are presented to aid in the description of various aspects of the invention and are provided solely for illustration and not limitation.

DETAILED DESCRIPTION

Figure 1:
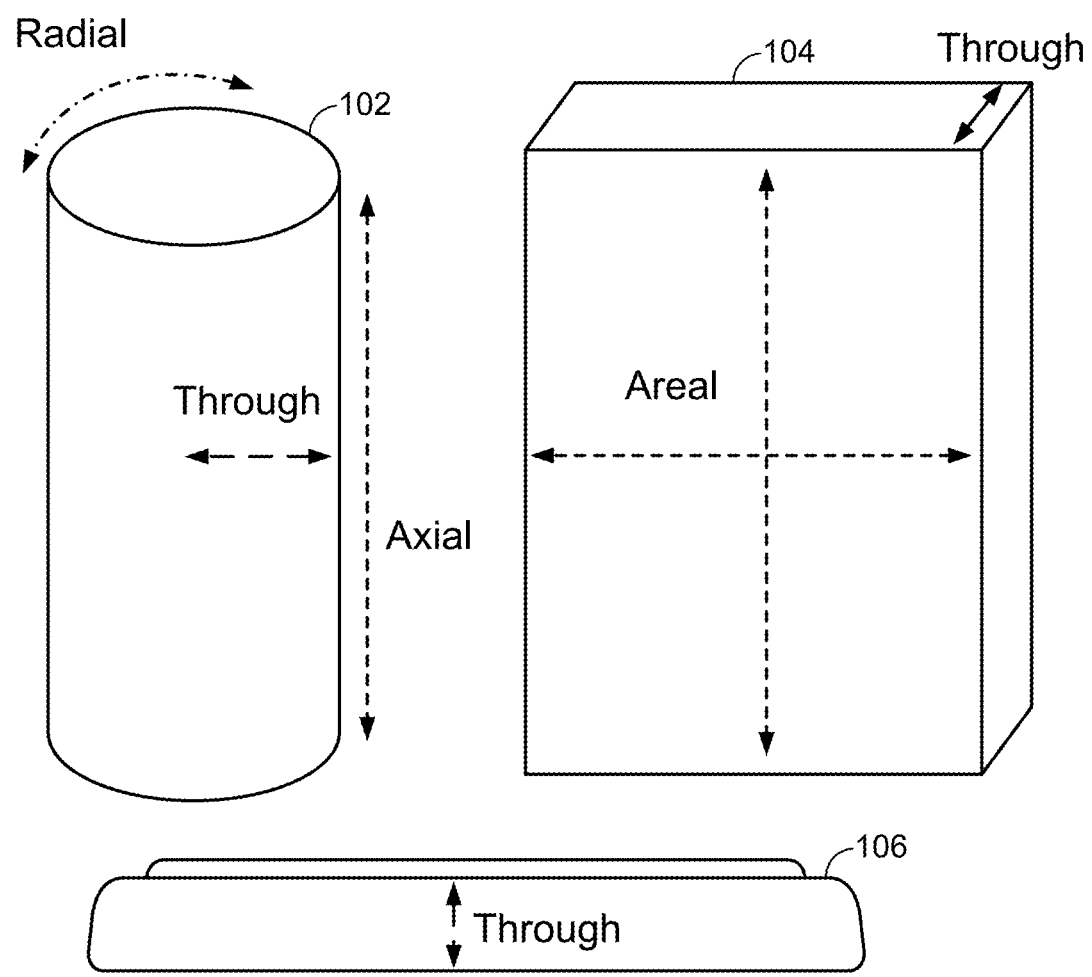
FIG. 1 illustrates different spatial distributions of potential properties of interest within a given cell.

Aspects of the invention are disclosed in the following description and related drawings directed to specific aspects of the invention. Alternate aspects may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any aspect described herein as "exemplary" is not necessarily to be construed as preferred or advantageous over other aspects. Likewise, the term "aspects of the invention" does not require that all aspects of the invention include the discussed feature, advantage or mode of operation.

The terminology used herein is for the purpose of describing particular aspects only and is not intended to be limiting of aspects of the invention. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Exemplary aspects of this disclosure are directed to arrangements of multiple transducers configured to capture the distributions in physical properties of batteries, which overcome the shortcomings of the conventional approaches discussed previously. Although reference is made to batteries under test or subject to analysis using the exemplary arrangements, it will be understood that the term "battery" is used to convey any type of electrochemical energy storage device whose physical properties are to be analyzed using exemplary acoustic-signal based techniques. Thus, the term battery may convey a single battery cell or a combination (e.g., a string) of battery cells, a battery module, a battery pack, etc., without deviating from the scope of this disclosure.

In an aspect, the arrangements include arrays of two or more transducers configured for analysis of physical properties, and more specifically in some aspects, studying the distribution of physical properties of a battery. Acoustic transducers may be configured to convert variations in electrical voltage into mechanical pressure or mechanical actuation, or vice versa. Thus, acoustic transducers may be configured to transmit acoustic signals through batteries or portions thereof. The transmitted acoustic signals or acoustic signals generated in response to the acoustic signals transmitted through the batteries or portions thereof may be received by one or more transducers (e.g., the same or different acoustic transducer which transmitted the acoustic signals), or in exemplary aspects, by other means for measuring vibrations such as one or more accelerometers, optical or laser-based sensors, etc., without departing from the scope of this disclosure.

Accordingly, acoustic transducers (or simply, transducers), possibly in conjunction with other means for sensing vibrations (e.g., accelerometers) may be used in performing analysis of batteries. For example, the analysis may be based on determining time of flight of acoustic signals transmitted through batteries or portions thereof and corresponding response signals received. For instance, acoustic signal based techniques may be utilized in electrochemical-acoustic signal interrogation (EASI) of the battery based on transmitting and receiving acoustic signals through at least a portion of the battery and studying characteristics of the transmitted and received signals.

Example physical properties of batteries under test that may be of interest in this disclosure include, but are not limited to, the density, thickness, porosity, tortuosity, or stiffness of individual layers or collections of layers within a battery; the viscosity, amount of or degree of wetting, or decomposition of the electrolyte; the formation of new layers within the battery; internal temperature; localized state of charge and state of health (or degradation thereof); local current density and electrochemical reaction rate, or combinations thereof. These properties, and their distributions within a battery, evolve during operation and influence the performance of the batteries.

Figure 2B:
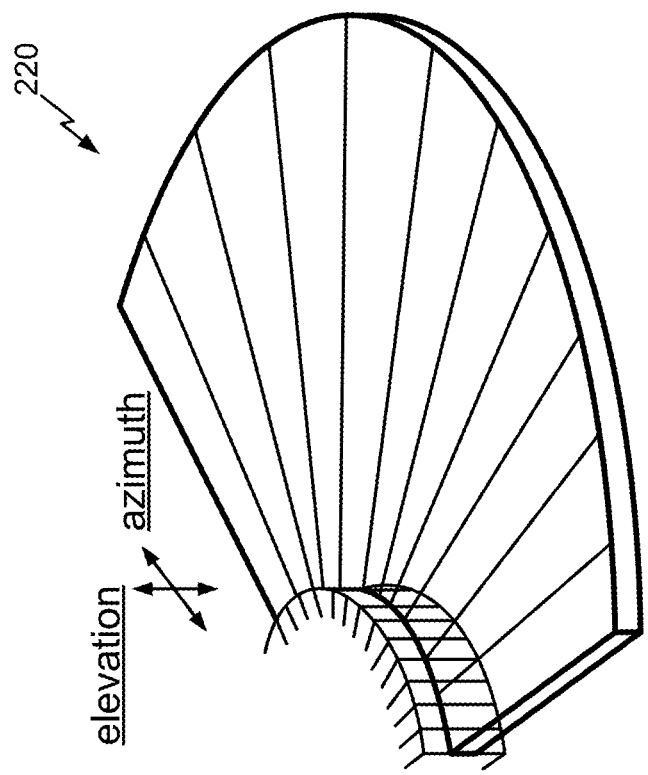
FIGS. 2A-2B illustrate example arrangements of an array of acoustic transducers.
Figure 2A:
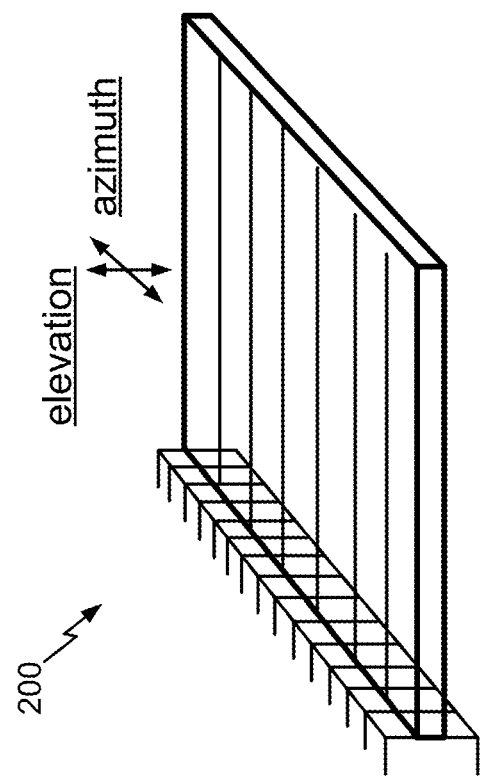

With reference to FIGS. 2A-B, example arrangements of transducers (e.g., acoustic transducers for EASI, accelerometers for vibratory measurements, etc.) configured to transmit/receive acoustic signals through/from at least portions of a battery. Accordingly, arrangements of two or more transducers, e.g., in the form of arrays, may be used to study distribution of physical properties of the batteries.

For example, as shown in FIG. 2A, arrangement 200 comprises a linear array of two or more transducers placed side-by-side, e.g., in a substantially straight line (keeping in mind that the transducers need not be tightly spaced or in contact with one another but may be sparsely spaced with a distance between one another while falling in a straight line arrangement). Arrangement 200 may be used to capture axial changes (e.g., any of the surfaces of a rectangular battery such as battery 104 or axial surfaces of battery 102).

Figure 2C:
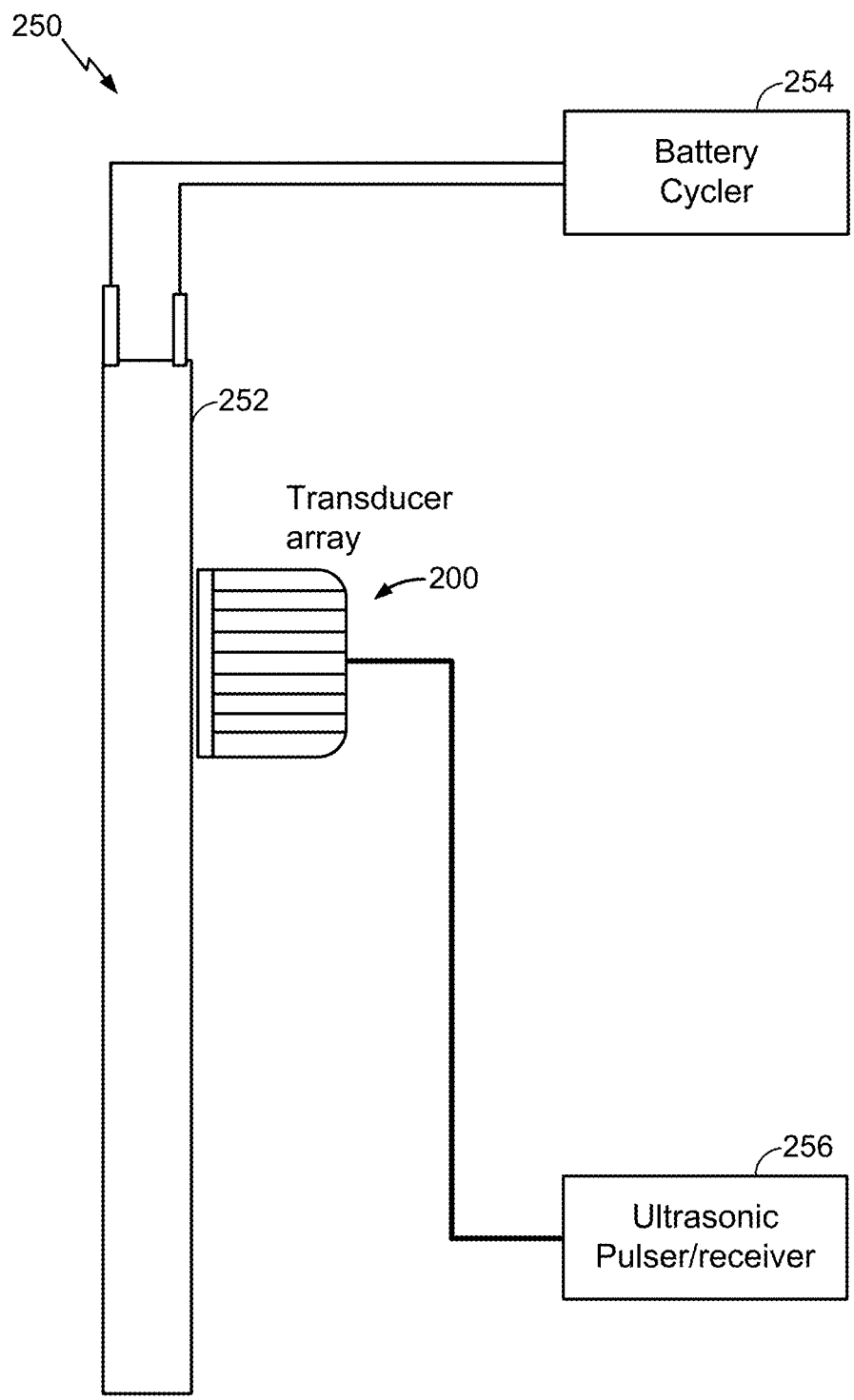
FIG. 2C illustrates an example apparatus comprising the example arrangements of FIG. 2A.

For instance, referring to FIG. 2C, an example system 250 for battery analysis using the exemplary arrangement 200 of transducers is shown. System 250 may include battery 252, which may be any type of battery under test. Arrangement 200 of transducers, e.g., in a linear array may be coupled to battery 252. The transducers of arrangement 200 may be coupled to a control module such as ultrasonic pulser/receiver 256, which may be configured to control individual ones of transducers of arrangement 200 to transmit pulses (at selected time instances and of selected magnitudes), and to receive responses to the transmitted pulses. Although not separately shown, a computer or processing means, generally referred to as an analyzer, may be coupled to or provided within ultrasonic pulser/receiver 256 for analyzing the data corresponding to the transmitted/received pulses and to determine distributions of physical properties of battery 252 based on this data. Battery cycler 254 is also shown, which may be coupled to leads or tabs of battery 252 and configured to control charge/discharge cycles of battery 252. In some aspects, studying the physical properties of battery 252 during different states of charge may reveal useful information pertaining to battery 252 and as such, battery cycler 254 may cooperate with the remaining components of system 250 accordingly.

FIG. 2B shows another example arrangement of transducers, arrangement 220, comprising a curvilinear array (which may be designed in concave or convex depending on specific needs) of two or more transducers placed side-by-side to form a curved shape (once again keeping in mind that the transducers need not be tightly spaced or in contact with one another but may be sparsely spaced with a distance between one another while falling in a curved shape arrangement). Arrangement 220 may be used to capture radial changes in battery physical properties, for example (e.g., they may be used on radial surface of battery 102 using a similar setup as system 250).

Figure 3B:
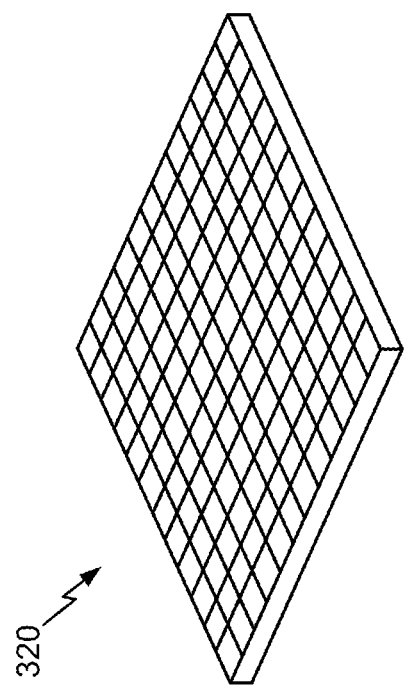
FIGS. 3A-3B illustrate other example arrangements of an array of acoustic transducers.
Figure 3A:
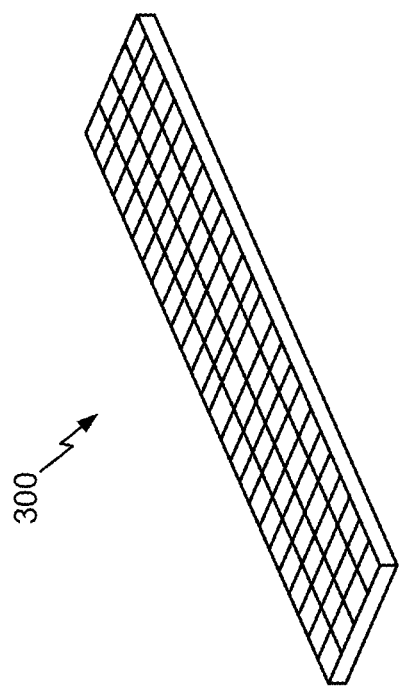

In exemplary aspects, the arrays of transducers need not be limited to a one-dimensional (1D) array. For example, as shown in FIGS. 3A-3B, according to other designs, transducers may also be arranged, two-dimensional (2D) arrays 300 and 320, which may be of any regular 2D shape, such as a rectangular, square, circle, ellipse, etc., or other irregular 2D shapes as well, without departing from the scope of this disclosure. Arrays 300-320, for example, may be configured to capture areal changes in physical properties (e.g., for battery 104, using a similar setup as system 250). Accordingly, exemplary arrays of transducers may be configured as a linear array or a curved array, based on whether the shape of the array or direction of distribution is radial, through, axial, or areal.

Furthermore, two or more arrays of transducers, e.g., pairs of transducer arrays (arranged in any of the above-described configurations of FIGS. 2A-B, 3A-B, e.g., linear, curvilinear, any 2D shape, or otherwise) may be used to perform spatially-resolved pulse/echo-mode measurements wherein the response acoustic signal is measured on the same side of the battery as the input or transmitted acoustic signal; or transmission-mode measurements, wherein the response acoustic signal is measured on a different side, e.g., opposite or across from the side of the battery that the input acoustic signal was transmitted from.

In exemplary aspects of this disclosure, the two or more transducers used in the various arrangements may be controlled as a group or controlled individually and independently depending on specific needs. For instance, for some types of analyses, each transducer of an exemplary array (e.g., according to configurations of FIGS. 2A-B, 3A-B) may be independently pulsed.

In an aspect, a single transducer can be pulsed (i.e., caused to generate an acoustic signal pulse) with enough temporal separation between pulses generated from adjacent or surrounding transducers of an array, such that a response signal received by a transducer of the array does not suffer from interference or unintended influences by the pulses from the adjacent transducers. It is also noted that if two or more transducers are placed far enough apart from each other (and not necessarily adjacent to each other in the array) such that two or more pulses respectively generated by the two or more transducers do not interfere with one another, then those two or more transducers may be pulsed simultaneously.

Figure 4:
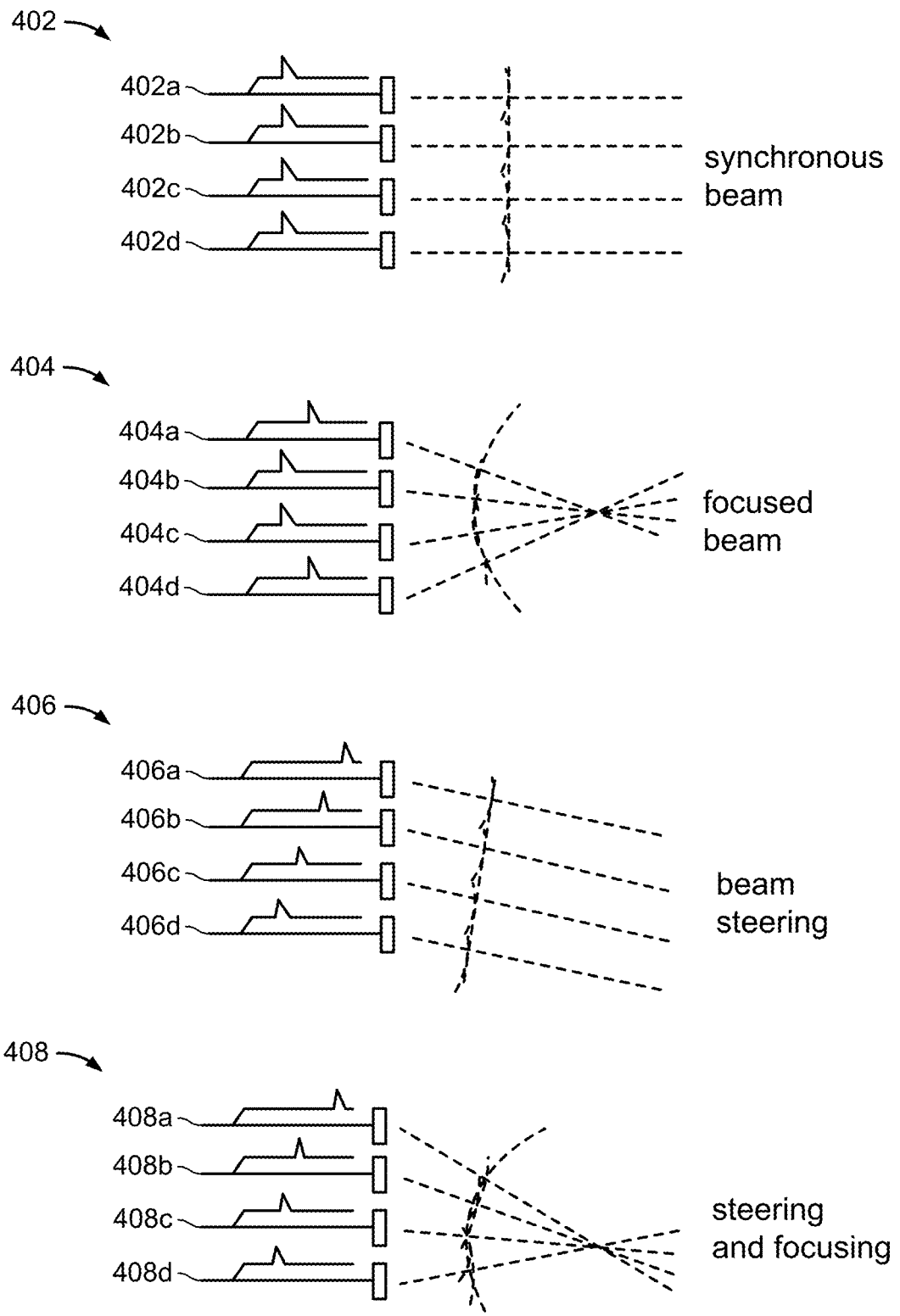
FIG. 4 illustrates examples of wavefronts generated based on controlling pulses of acoustic transducers disposed in example arrangements.

With reference to FIG. 4, aspects of creating different wavefronts based at least in part on adjusting relative pulse timing of two or more transducers in an exemplary array (e.g., according to configurations of FIGS. 2A-B, 3A-B deployed in setups such as system 250) are illustrated. Starting with wavefront 402, it is possible to configure two or more transducers in an array (e.g., linear array 200) to be pulsed or generate pulses, respectively and representatively shown with reference numerals 402*a-d* simultaneously, so that the acoustic wavefront (at least initially) is a synchronous beam, whose shape is conformal to the shape of the array (linear, in this case). It will be understood that the shape of wavefront 402 may not be synchronous during the entirety of the transmission of pulses 402*a-d* through at least portions of a battery under test to which wavefront 402 is applied because pulses 402*a-d* may encounter non-uniform effects due to variations in physical properties of the battery over the course of their travel. For instance, local differences in properties such as particle size, electrode density, thickness, etc. may affect wavefront 402 as well as any response acoustic signals generated as a result of the transmission of wavefront 402 through the battery under test.

Referring to wavefronts 404-406, it is seen that respective pulses may be staggered in predetermined patterns by controlling the pulsing of transducers in the arrays to result in different wavefront shapes. For instance, the transducers in an array may be pulsed in quick succession so that the pulses interact with each other. Such an approach may be referred to as a phased array. Depending on the sequence and timing of the pulses, a number of wavefronts such as wavefronts 404-408 may be created. Wavefront 404 represents a focused beam in which the waves caused by respective pulses 404*a-d* may constructively interfere at a predetermined or specified point. Wavefront 406 represents a steered beam in which the waves of respective pulses 406*a-d* travel in a desired direction which diverges from the direction of the synchronous beam of wavefront 402 caused by simultaneous pulsing discussed above. Wavefront 408 represents a combination of wavefronts 404 and 406 wherein a steered and focused beam may be created by timing pulses 408*a-d* in a manner in which the position of the focal point of wavefront 404 may be moved.

In some exemplary aspects, cross-sections of a battery may be studied. For instance, the response from one or more pulses from a single transducer may be detected by the other transducers in an exemplary array, which allows for an understanding of the scattering behavior and can provide tomographic-like (e.g., X-ray tomography) information.

Figure 5:
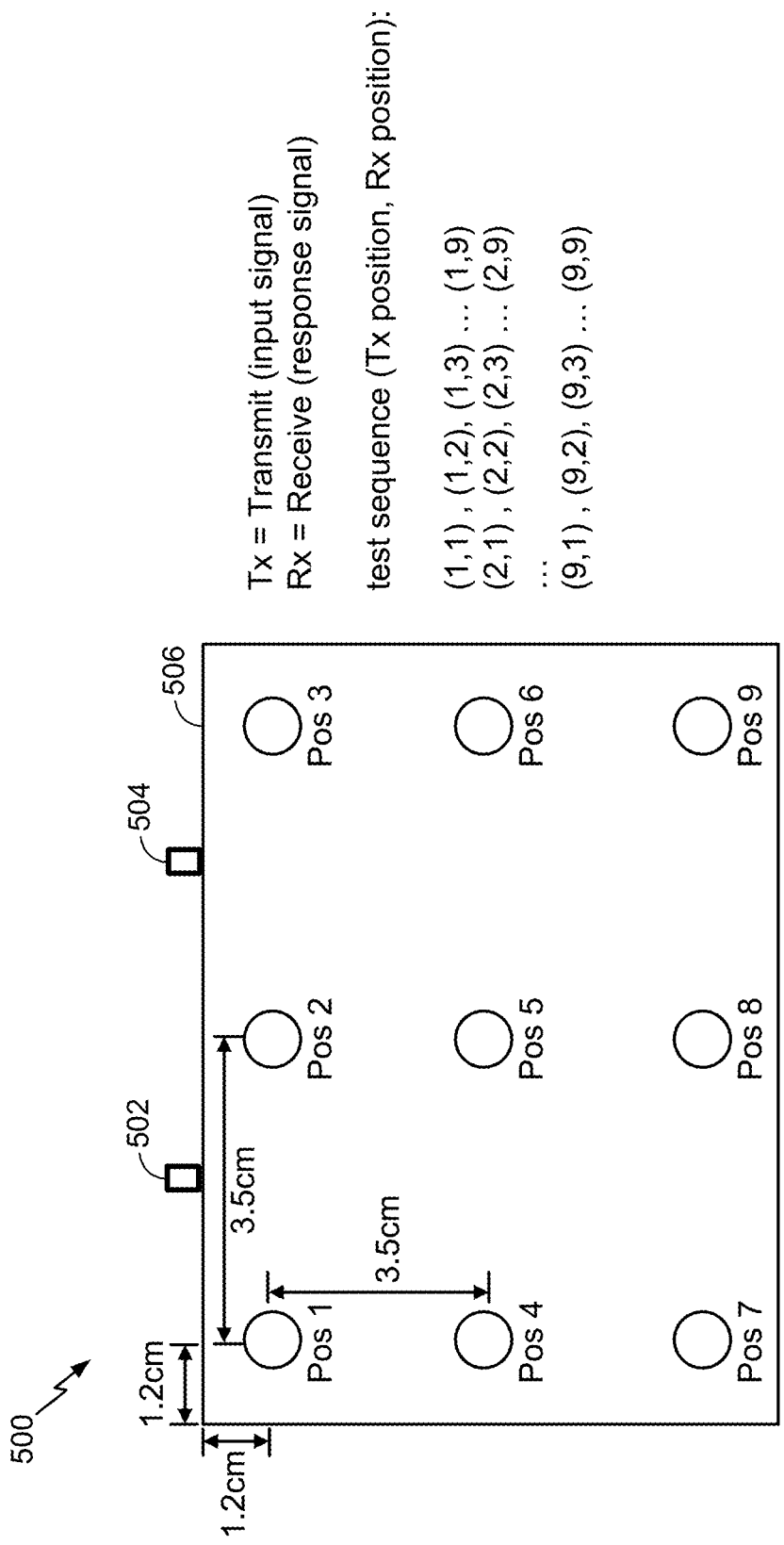
FIG. 5 illustrates an example 2D array of transducers for analyzing scattering behavior across a cross section of an example battery.

For example, with reference to FIG. 5, exemplary array 500 of transducers is shown, wherein the transducers are arranged in a 2D rectangular shape, or more specifically, square shape. Array 500 may be configured to analyze scattering behavior with respect to a cross section 506 of a battery. The battery itself may be of any shape or size, and tabs 502 and 504 are identified merely for reference, without any associated inherent limitations to the arrangement shown. Array 500, as illustrated, comprises nine transducers, disposed in positions labeled pos 1-9. Each of these transducers may be configured to transmit an input acoustic signal into cross section 506 the battery (e.g., in a direction into the page) and receive a response acoustic signal from any one of the transmitted acoustic signals.

A sequence of tests may be performed to study (transmit Tx, response Rx) pairs of acoustic signals which are identified based on the position (pos 1-9) of the transmitting transducer and the position (pos 1-9) of the receiving transducer. These signal pairs are shown with the notation (Tx position, Rx position) corresponding to the transmitting transducer and receiving transducer's positions and are identified as (1, 1) to (9, 9). By studying the signal pairs in the various elements of the sequence, scattering behavior of the signals pertaining to cross section 506 may be understood. For instance, if transmit, receive signal pairs studied for each of the transducers configured to transmit and receive the signals (e.g., pairs (1,1), (2,2), . . . (9, 9)) may reveal information pertaining to any inhomogeneity that may exist in cross section 506 of the battery. Similarly, by studying the differences in the received signal strength for different receiving transducers for the same input signal from a transmitting transducer (e.g., pairs (1, 1), (1, 5), (1,9)), the changes which cause signal fading across the various receiving transducers separated from the transmitting transducer by different distances may be studied. In this manner, various other scattering behaviors of signals may be used to determine properties of the battery, e.g., at least within cross section 506.

It will be appreciated that aspects include various methods for performing the processes, functions and/or algorithms disclosed herein. For example, in addition to spatially-deterministic information about the acoustic response and physical properties of internal battery components, the data gathered from such transducer arrays can be analyzed with physical models and related algorithms to reconstruct spatial and volumetric mappings of the physical properties of the battery. Such an exemplary tomographic-like approach in the field of battery diagnostics may be used to enable an in-field, in-use, at-scale physical analysis of batteries which is not known to be possible to achieve using conventional approaches.

Figure 6:
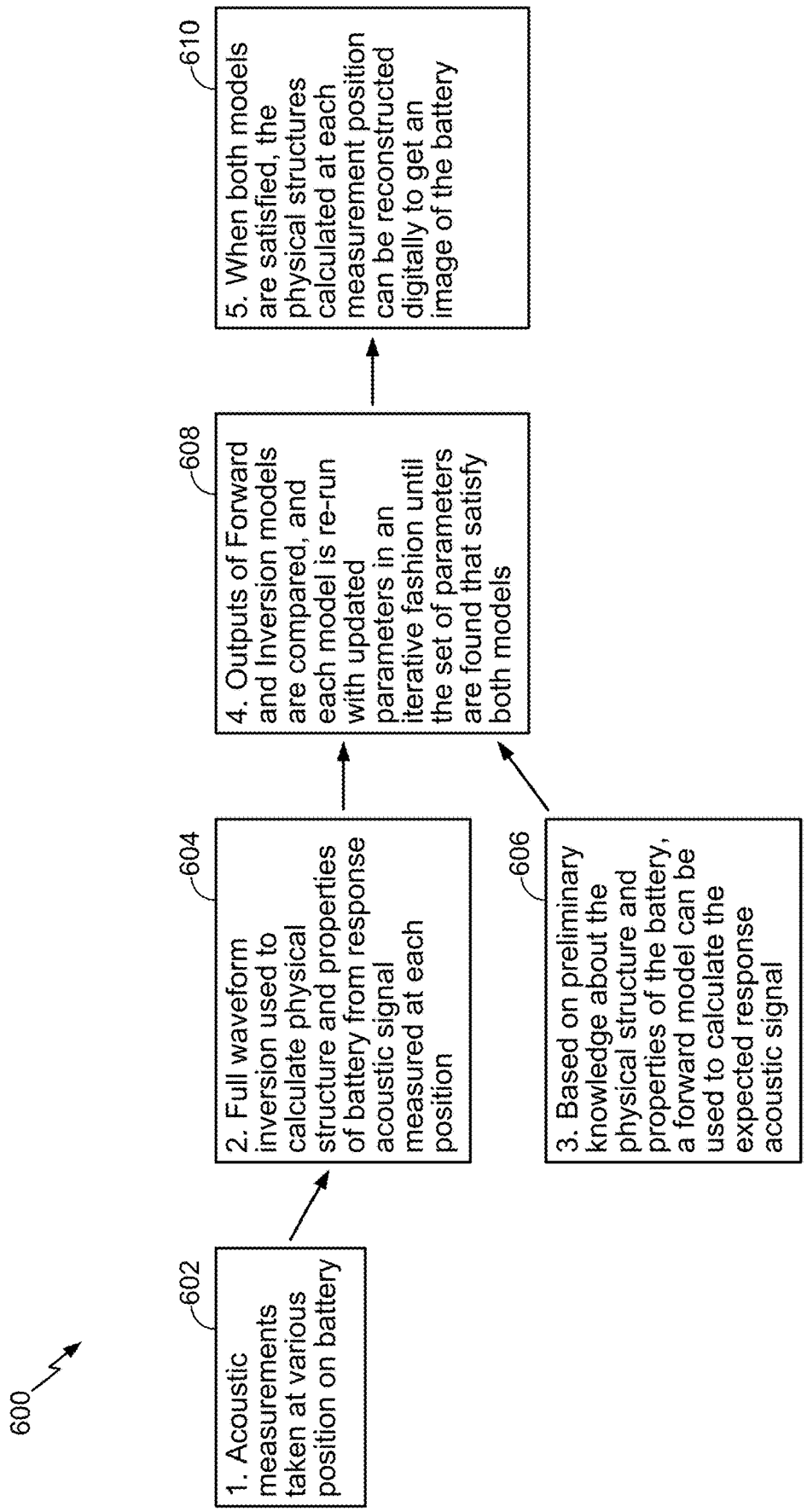
FIG. 6 illustrates an example process by which acoustic data and previous knowledge about the structure of the battery are used to calculate physical properties and reconstruct an image of an example battery.

With reference now to FIG. 6, an example process 600 by which the acoustic data and previous knowledge about the structure of the battery can be used to calculate physical properties and reconstruct an image. The various steps or blocks of process 600 will now be explained in greater detail.

Starting in step 602, acoustic measurements may be taken at various positions on a battery under test (e.g., as explained with reference to FIG. 5 above at various transmit, receive positions).

In step 604, an inversion model may be used, wherein aspects of the physical structure and properties of the battery may be estimated or calculated from the acoustic signals measured at the various positions.

In a corollary step 606, a forward model may be used to calculate the expected response acoustic signals at the various points based on a preliminary physical structure and properties of the battery (e.g., based on prior knowledge about a baseline or initial physical structure and properties of the battery).

In step 608, the outputs of the inversion model from step 604 and the forward model from step 606 may both be studied, e.g., compared to one another in an effort to converge the two models. For instance the two models may be re-run with updated parameters obtained from the comparison and the two models may be rerun in an iterative manner until the models converge (e.g., a set of parameters used to define the two models are determined wherein the set of parameters satisfy both the inversion model and the forward model).

In step 610, upon both models being satisfied, the physical structures of the battery calculated at each measurement position may be reconstructed digitally to obtain a digital image of the battery.

Figure 7A:
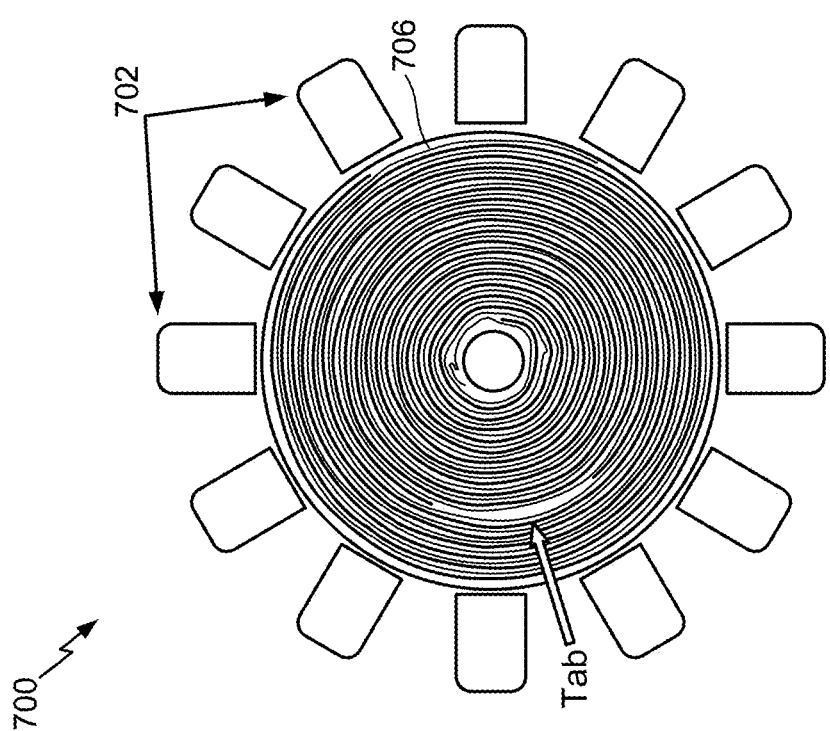
FIGS. 7A-B, illustrate aspects of an example of process of FIG. 6 applied to a battery comprising a cylindrical cell.
Figure 7B:
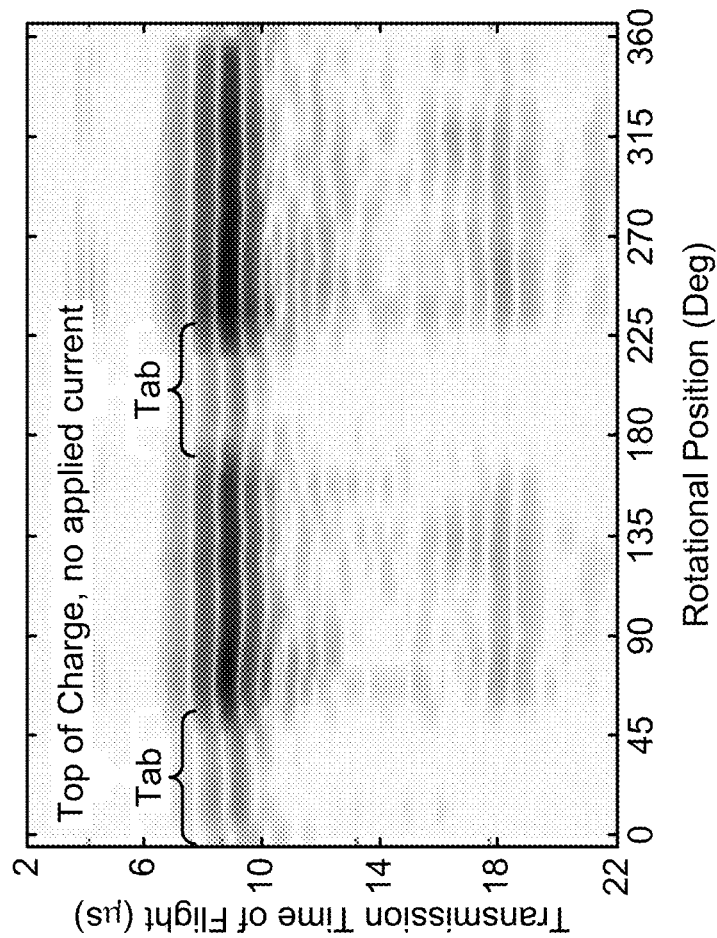

With reference to FIGS. 7A-B, aspects of an example of process 600 applied to battery 706 comprising a cylindrical cell is shown. In FIG. 7A, various transducers, generally identified by the reference numeral 702 are shown to be disposed in an example curvilinear arrangement around a cross sectional area of battery 702, are illustrated. Transducers 702 may be configured to transmit and/or receive acoustic signals according to this disclosure and measurements from these may be used to analyze to reconstruct structural images of battery 702 using process 600. Also shown are tabs, such as tab 704 of battery 706. The location of these tabs may be determined by the above approach.

In FIG. 7B, transmission time of flight pertaining to acoustic signals is plotted on the Y-axis with corresponding transducers 702 shown on the X-axis, identified by their rotational position on battery 706 of FIG. 7A. The transmission times and intensities of acoustic signals shown in FIG. 7B reveal a rotational tomography of battery 706. The signal intensities are seen to fade at the position where tabs such as tab 704 are present. In this manner, tabs or any other defects, deformities, or inhomogeneity in battery 706 may be detected.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Accordingly, an aspect of the invention can include a computer-readable media embodying a method for analyzing a battery using exemplary arrangements of transducers. Accordingly, the invention is not limited to illustrated examples and any means for performing the functionality described herein are included in aspects of the invention.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. An apparatus comprising:
   a plurality of transducers;
   a controller configured to control,
      one or more of the plurality of transducers to (1) generate an acoustic signal having one of a plurality of different shapes of wavefronts and (2) transmit the acoustic signal through at least a portion of a battery, and
      two or more of the plurality of transducers located at corresponding two or more positions across a cross section of the battery to receive acoustic response acoustic signals in response to transmission of the acoustic signal through at least the portion of the battery; and
   an analyzer configured to determine one or more physical properties of the battery based on the acoustic response signals at the two or more transducers located at the corresponding two or more positions.

2. The apparatus of claim 1, wherein the plurality of transducers are arranged as an array having a shape corresponding to a surface of the battery or a direction of distribution of the physical properties of the battery.

3. The apparatus of claim 2, wherein the array is one of a linear array or a curved array, based on whether the surface of the battery or the direction the distribution of the physical properties is radial, through, axial, or areal.

4. The apparatus of claim 2, wherein the array is two-dimensional.

5. The apparatus of claim 1, wherein a distance between at least two transducers in the plurality of transducers is based on a tightly spaced arrangement or a sparsely spaced arrangement of the plurality of transducers.

6. The apparatus of claim 1, wherein the controller is configured to control relative timing between two or more pulses transmitted through the one or more of the plurality of transducers to generate the acoustic signal having the one of the plurality of different shapes of wavefronts.

7. The apparatus of claim 6, wherein the one of the plurality of different shapes of wavefronts is a synchronous beam.

8. The apparatus of claim 6, wherein the plurality of different shapes of wavefronts include a focused beam, a steered beam, and a focused and steered beam.

9. The apparatus of claim 1, wherein the physical properties include one or more of:
   density, thickness, porosity, tortuosity, or stiffness of individual layers or collections of layers within a battery;
   viscosity, amount of or degree of wetting, or decomposition of an electrolyte of the battery;
   formation of new layers within the battery;
   internal temperature;
   localized state of charge, state of health or state of degradation of the battery;
   local current density and electrochemical reaction rate of the battery; or combinations thereof.

10. The apparatus of claim 1, further comprising:
    one or more accelerometers coupled to the battery, the one or more accelerometers configured to receive the acoustic response signals.

11. A method of battery analysis, the method comprising:
    controlling one or more of a plurality of transducers coupled to a battery to (1) generate an acoustic signal having one of a plurality of different shapes of wavefronts and (2) transmit the acoustic signal through at least a portion of the battery;
    controlling two or more of the plurality of transducers located at corresponding two or more positions across a cross section of the battery to receive acoustic response signals in response to transmission of the acoustic signal through at least the portion of the battery; and
    determining one or more physical properties of the battery based on the acoustic response signals received at the two or more transducers located at the corresponding two or more positions.

12. The method of claim 11, further comprising:
    controlling a relative timing between two or more pulses transmitted through the one or more of the plurality of transducers to generate the acoustic signal having the one of the plurality of different shapes of wavefronts.

13. The method of claim 12, wherein one of the plurality of different shapes of wavefronts is a synchronous beam.

14. The method of claim 12, wherein the plurality of different shapes of wavefronts includes a focused beam, a steered beam, and a focused and steered beam.

15. The method of claim 11, wherein the physical properties include one or more of:
    density, thickness, porosity, tortuosity, or stiffness of individual layers or collections of layers within a battery;
    viscosity, amount of or degree of wetting, or decomposition of an electrolyte of the battery;
    formation of new layers within the battery;
    internal temperature;
    localized state of charge, state of health or state of degradation of the battery;
    local current density and electrochemical reaction rate of the battery; or
    combinations thereof.

16. A non-transitory computer-readable media comprising computer-readable instructions stored therein which, when executed by one or more processors, cause the one or more processors to:
    control one or more of a plurality of transducers coupled to a battery to (1) generate an acoustic signal having one of a plurality of different shapes of wavefronts and (2) transmit the acoustic signal through at least a portion of the battery;
    control two or more of the plurality of transducers located at corresponding two or more positions across a cross section of the battery to receive acoustic response signals in response to transmission of the acoustic signal through at least the portion of the battery; and
    determine one or more physical properties of the battery based on the acoustic response signals received at the two or more transducers located at the corresponding two or more positions.

17. The non-transitory computer-readable media of claim 16, wherein the execution of the computer-readable instructions by the one or more processors, further cause the one or more processors to:
    control a relative timing between two or more pulses transmitted through the one or more of the plurality of transducers to generate the acoustic signal having the one of the plurality of different shapes of wavefronts.

18. The non-transitory computer-readable media of claim 17, wherein one of the plurality of shapes of wavefronts is a synchronous beam.

19. The non-transitory computer-readable media of claim 17, wherein the plurality of different shapes of wavefronts includes a focused beam, a steered beam, and a focused and steered beam.

20. The non-transitory computer-readable media of claim 16, wherein the physical properties include one or more of:
density, thickness, porosity, tortuosity, or stiffness of individual layers or collections of layers within a battery;
viscosity, amount of or degree of wetting, or decomposition of an electrolyte of the battery;
formation of new layers within the battery;
internal temperature;
localized state of charge, state of health or state of degradation of the battery;
local current density and electrochemical reaction rate of the battery; or combinations thereof.

* * * * *